(12) United States Patent
Kang et al.

(10) Patent No.: US 12,727,385 B2
(45) Date of Patent: Sep. 1, 2026

(54) HAPTIC ACTUATOR WITH JIG MEMBER CONFIGURED TO AMPLIFY PIEZOELECTRIC ELEMENT DISPLACEMENT

(71) Applicant: Korea Electronics Technology Institute, Seongnam-si (KR)

(72) Inventors: Hyung Won Kang, Seoul (KR); Seung Ho Han, Gwacheon-si (KR); Intae Seo, Gwangju-si (KR)

(73) Assignee: Korea Electronics Technology Institute, Seongnam-si (KR)

( * ) Notice: Subject to any disclaimer, the term of this patent is extended or adjusted under 35 U.S.C. 154(b) by 898 days.

(21) Appl. No.: 18/098,177

(22) Filed: Jan. 18, 2023

(65) Prior Publication Data

US 2023/0232720 A1 Jul. 20, 2023

(30) Foreign Application Priority Data

Jan. 18, 2022 (KR) ........................ 10-2022-0007369

(51) Int. Cl.
*H10N 30/20* (2023.01)
*G06F 3/01* (2006.01)

(52) U.S. Cl.
CPC ......... *H10N 30/2023* (2023.02); *G06F 3/016* (2013.01)

(58) Field of Classification Search
CPC ............................ H10N 30/2023; G06F 3/016
See application file for complete search history.

(56) References Cited

FOREIGN PATENT DOCUMENTS

| | | | |
|---|---|---|---|
| KR | 10-2011-0045486 | A | 5/2011 |
| KR | 10-2014-0135085 | A | 11/2014 |
| KR | 10-1664257 | B1 | 10/2016 |
| KR | 10-2017-0137422 | A | 12/2017 |

OTHER PUBLICATIONS

Korean Office Action issued on Oct. 23, 2023, in counterpart Korean Patent Application No. 10-2022-0007369 (2 pages in English, 4 pages in Korean).

*Primary Examiner* — Emily P Pham
*Assistant Examiner* — Monica Mata
(74) *Attorney, Agent, or Firm* — NSIP Law

(57) ABSTRACT

A haptic actuator is disclosed. The haptic actuator includes a polygonal piezoelectric element configured to generate a displacement thereof while expanding and contracting in accordance with polarities of a voltage applied thereto, and a jig member coupled to the piezoelectric element at upper and lower sides of the piezoelectric element in a thickness direction of the piezoelectric element in a state of contacting only corners of the piezoelectric element and configured to amplify the displacement generated at the piezoelectric element, thereby vibrating. The jig member amplifies the displacement generated at the piezoelectric element and, as such, vibrates. Accordingly, it is possible to provide excellent haptic effects with high resolution to the user, using even a small voltage.

6 Claims, 8 Drawing Sheets

FIG.1

HAPTIC ACTUATOR WITH JIG MEMBER CONFIGURED TO AMPLIFY PIEZOELECTRIC ELEMENT DISPLACEMENT

CROSS REFERENCE TO RELATED APPLICATION

The present application claims priority to Korean Patent Application No. 10-2022-0007369, filed Jan. 18, 2022, the entire contents of which is incorporated herein for all purposes by this reference.

BACKGROUND OF THE INVENTION

Field of the Invention

Embodiments of the present invention relate to a haptic actuator.

Description of the Related Art

Recently, active research on a metaverse expanding an actual real world to a digital-based virtual word, such as augmented reality (AR), virtual, reality (VR), or the like, has been conducted. In a virtual space of the metaverse, the user may have a synesthetic experience with high immersion, like interaction in actual reality, through not only audiovisual feedback provided in a virtual world, but also tactile feedback such as haptics.

As an element applied to haptic technology for providing tactile feedback with high resolution to the user, there is a piezoelectric element. The piezoelectric element is an element configured to realize a piezoelectric effect, that is, generation of a voltage when a mechanical strain is applied to the element from the outside or generation of a displacement when the element expands or contracts in accordance with a voltage applied thereto.

Such a piezoelectric element may provide haptic effects to the user as the piezoelectric element generates a displacement through expansion and contraction thereof and, as such, vibrates. The piezoelectric element may provide distinct haptic effects with fast response time and high resolution, as compared to a method using an existing eccentric motor.

However, the maximum displacement of the piezoelectric element may be limited in accordance with the material or the shape of the piezoelectric element or the magnitude of the voltage applied to the piezoelectric element. Therefore, it is important to efficiently generate higher-intensity vibrations even when the same voltage is applied.

RELATED ART LITERATURE

Patent Documents

Patent Document 1: KR 10-2017-0137422 A

SUMMARY OF THE INVENTION

Therefore, the present invention has been made in view of the above problems, and it is an object of the present invention to provide a haptic actuator capable of vibrating at a higher vibrational acceleration using a maximum displacement generated at a piezoelectric element thereof, thereby providing excellent haptic effects with high resolution to the user.

It is another object of the present invention to provide a haptic actuator in which a geometric structure of a jig member optimized for a square piezoelectric element, to maximally utilize a displacement generated at the square piezoelectric element, is implemented.

In accordance with an aspect of the present invention, the above and other objects can be accomplished by the provision of a haptic actuator including a polygonal piezoelectric element configured to generate a displacement thereof while expanding and contracting in accordance with polarities of a voltage applied thereto, and a jig member coupled to the piezoelectric element at upper and lower sides of the piezoelectric element in a thickness direction of the piezoelectric element in a state of contacting only corners of the piezoelectric element and configured to amplify the displacement generated at the piezoelectric element, thereby vibrating.

The piezoelectric element may be formed to have a square shape.

The jig member may include a center part disposed at a center of the jig member and spaced apart from the piezoelectric element, to vibrate, an edge part contacting each corner of the piezoelectric element, to receive mechanical energy generated due to the displacement generated by the piezoelectric element, and a bridge part interconnecting the center part and the edge part, to transfer the mechanical energy received from the edge part to the center part.

The edge part may be formed to have a vertically bent shape such that the edge part conforms to each corner portion of the piezoelectric element.

The center part may be formed to have a circular shape. The bridge part may be formed such that opposite longitudinal sides thereof are placed on tangent lines between opposite ends of the edge part in a thickness direction of the edge part and the center part, respectively.

The bridge part may be formed such that the opposite longitudinal sides thereof are inwardly bent while having a predetermined radius of curvature (r).

The bridge part may be formed such that the opposite longitudinal sides thereof are bent while having the radius of curvature (r) by circles circumscribed on the center part while passing through respective opposite ends of the edge part in the thickness direction of the edge part, respectively.

A ratio (b/a) of a length (b) of the edge part disposed in parallel to each side of the piezoelectric element with respect to a length (a) of the side of the piezoelectric element may be 0.15 to 0.20.

The ratio (b/a) of the length (b) of the edge part disposed in parallel to each side of the piezoelectric element with respect to the length (a) of the side of the piezoelectric element may be 0.15. A ratio (c/b) of a thickness (c) of the edge part disposed perpendicularly to the length (b) of the edge part with respect to the length (b) of the edge part may be 0.27 to 0.4.

The ratio (b/a) of the length (b) of the edge part disposed in parallel to each side of the piezoelectric element with respect to the length (a) of the side of the piezoelectric element may be 0.15, the ratio (c/b) of the thickness (c) of the edge part disposed perpendicularly to the length (b) of the edge part with respect to the length (b) of the edge part may be 0.27, and the bridge part may be formed such that opposite longitudinal sides thereof are inwardly bent while having a predetermined radius of curvature (r), and a ratio (r/a) of the radius of curvature (r) with respect to the length (a) of the side of the piezoelectric element may be 0.8 to 0.9.

Prior to the description, it should be understood that the terms used in the specification and appended claims should not be construed as limited to general and dictionary meanings, but interpreted based on the meanings and concepts corresponding to technical aspects of the present invention on the basis of the principle that the inventor is allowed to define terms appropriately for best explanation.

BRIEF DESCRIPTION OF THE DRAWINGS

The above and other objects, features and other advantages of the present invention will be more clearly understood from the following detailed description taken in conjunction with the accompanying drawings, in which:

FIG. 1 is a perspective view of a haptic actuator according to an exemplary embodiment of the present invention;

DETAILED DESCRIPTION OF THE INVENTION

Figure 2:
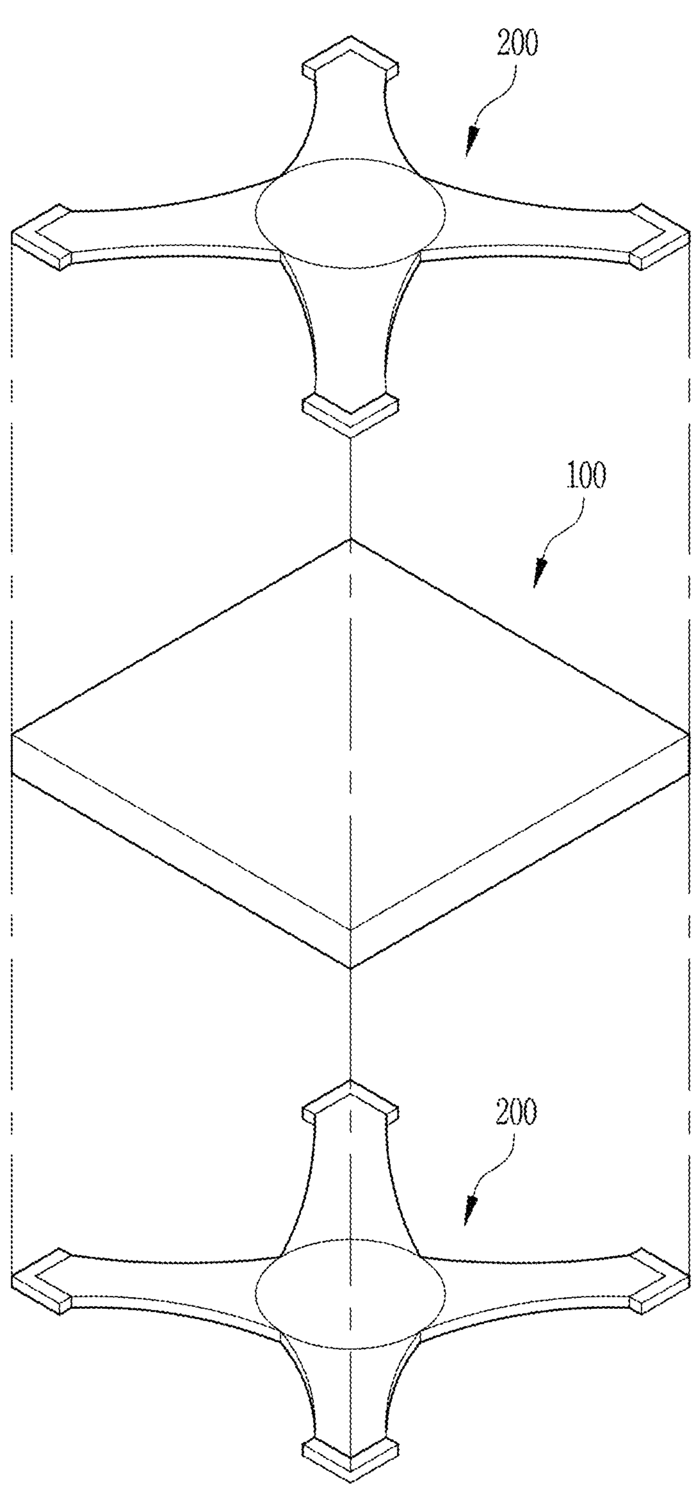
FIG. 2 is an exploded perspective view of the haptic actuator according to the exemplary embodiment of the present invention.

Objects, particular advantages and new features of the present invention will be more clearly understood from the following detailed description and preferred embodiments taken in conjunction with the accompanying drawings. In the specification, in adding reference numerals for elements in each drawing, it should be noted that like reference numerals already used to denote like elements in one drawing are also used to denote the elements in another drawing wherever possible. In addition, the terms “one surface”, “the other surface”, “first” and “second” are used to differentiate one constituent element from another constituent element, and these constituent elements should not be limited by these terms. In the following description, when a detailed description of the relevant known function or configuration is determined to unnecessarily obscure the subject matter of the present invention, such detailed description will be omitted.

Meanwhile, it should be understood that, when terms representing directions such as upwards, downwards, left, right, X-axis, Y-axis, Z-axis, etc. are used in the specification, these terms are merely for convenience of description, and such directions may be expressed differently from those represented by the terms, in accordance with the viewing position of an observer or the position at which an object is disposed.

It should be noted that terms used herein are merely used to describe a specific embodiment, not to limit the present invention. Incidentally, unless clearly used otherwise, singular expressions include a plural meaning.

Hereinafter, exemplary embodiments of the present invention will be described in detail with reference to the accompanying drawings.

Figure 1:
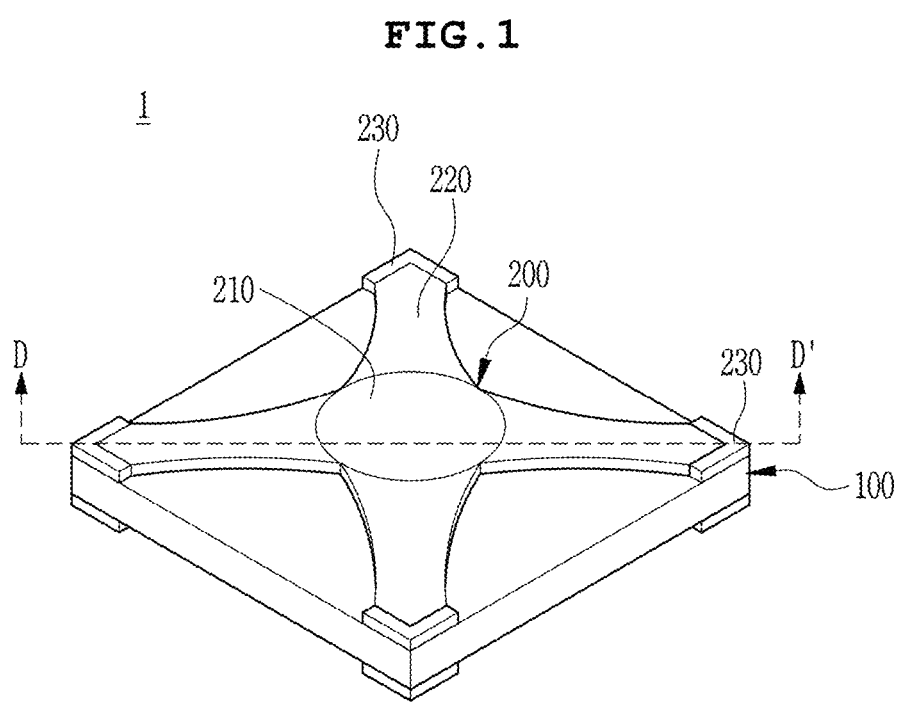
Figure 3:
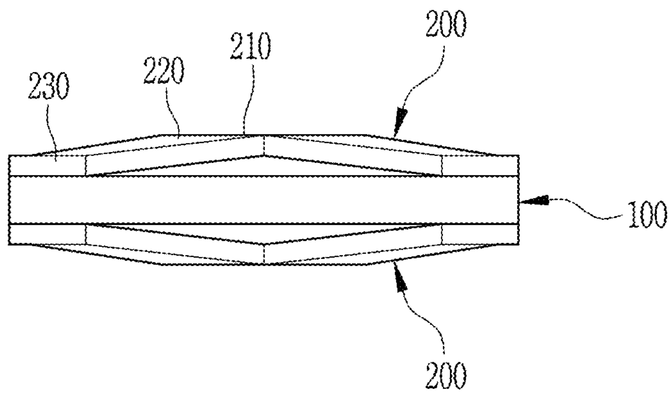
FIG. 3 is a front view of the haptic actuator according to the exemplary embodiment of the present invention.
Figure 4:
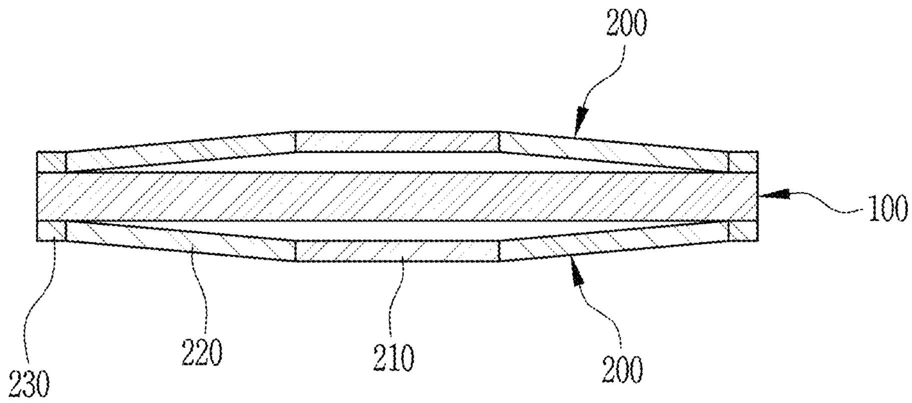
FIG. 4 is a cross-sectional view taken along line D-D' in FIG. 1.
Figure 5:
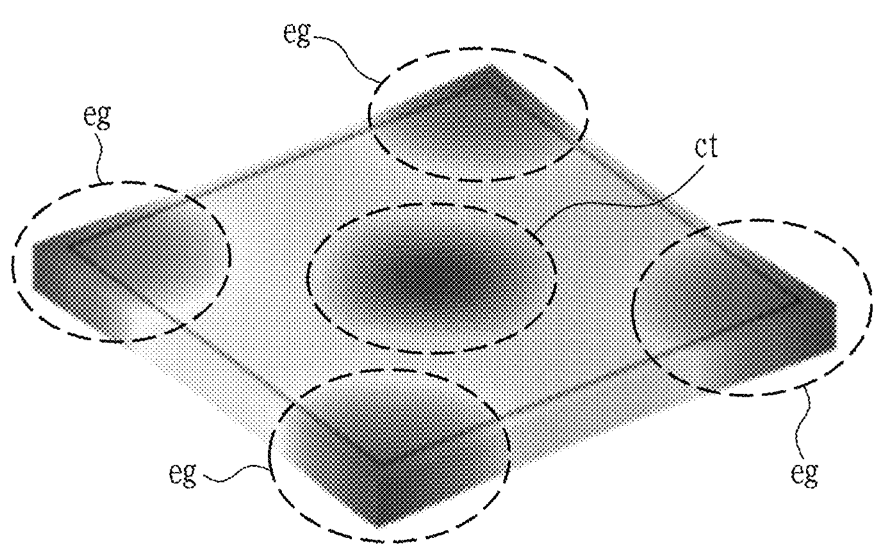
FIG. 5 shows a magnitude of a displacement of a square piezoelectric element through simulation.

FIG. 1 is a perspective view of a haptic actuator 1 according to an exemplary embodiment of the present invention. FIG. 2 is an exploded perspective view of the haptic actuator 1 according to the exemplary embodiment of the present invention. FIG. 3 is a front view of the haptic actuator 1 according to the exemplary embodiment of the present invention. FIG. 4 is a cross-sectional view taken along line D-D' in FIG. 1. FIG. 5 shows a magnitude of a displacement of a square piezoelectric element through simulation. The following description will be given referring to FIGS. 1 to 5.

The haptic actuator 1 according to the exemplary embodiment of the present invention includes a polygonal piezoelectric element 100 configured to generate a displacement thereof while expanding and contracting in accordance with polarities of a voltage applied thereto, and a jig member 200 coupled to the piezoelectric element 100 at upper and lower sides of the piezoelectric element 100 in a thickness direction of the piezoelectric element 100 in a state of contacting only corners of the piezoelectric element 100 and configured to amplify the displacement generated at the piezoelectric element 100, thereby vibrating.

In accordance with the exemplary embodiment of the present invention, it may be possible to provide haptic effects with high resolution by amplifying a displacement generated by the piezoelectric element 100 and, as such, efficiently realizing strong vibration using even a small voltage.

The piezoelectric element 100 may repeatedly expand and contract in accordance with polarities of a voltage applied thereto, thereby generating a displacement. In this case, the direction of the displacement generated by the piezoelectric element 100 may mainly be a transverse direction of the piezoelectric element 100 placed on a surface perpendicular to the thickness direction of the piezoelectric element 100. That is, when a voltage is applied to the piezoelectric element 100, the piezoelectric element 100 may generate a displacement while repeatedly expanding and contracting in the transverse direction.

The piezoelectric element 100 may be formed to have various shapes such as a circular shape, a polygonal shape, a rectangular shape, etc. in accordance with purposes thereof and a device to which the piezoelectric element 100 is applied. As shown in FIGS. 1 to 4, the piezoelectric element 100 may be formed to have a square shape. In addition, the simulation of FIG. 5 represents a displacement simulation of the piezoelectric element 100 formed to have a square shape. In FIG. 5, a dark region(ct) in the center represents a region where a minimum displacement is generated, and a dark region(eg) at each corner portion represents a region where a maximum displacement is generated. Referring to FIG. 5, it may be seen that, in the piezoelectric element 100 formed to have a square shape, a maximum displacement is generated at each corner portion disposed farthest from a center.

A maximum value of the displacement generated at the piezoelectric element 100 may be exhibited at each corner portion of the piezoelectric element 100 because the piezoelectric element 100 is formed to have a square shape, as shown in FIG. 5. In addition, the jig member 200 may be coupled to the piezoelectric element 100 such that the jig member 200 contacts only each corner portion of the square piezoelectric element 100, as will be described later.

Through the above-described structure according to the exemplary embodiment of the present invention, haptic feedback may be more efficiently realized using even small electric power by concentrating, on each corner of the piezoelectric element 100, a maximum displacement generated at the piezoelectric element 100, and vibrating the jig member 200 through transfer of only the concentrated maximum displacement to the jig member 200.

As shown in FIG. 2, the jig member 200 may be coupled to the piezoelectric element 100 at upper and lower sides of the piezoelectric element 100 in the thickness direction of the piezoelectric element 100. The jig member 200 may be formed to be coupled to the piezoelectric element 100 such that the jig member 200 contacts only each corner portion of the piezoelectric element 100 at a portion thereof while being spaced apart from the piezoelectric element 100 at a remaining portion thereof.

The portion of the jig member 200 contacting the corner of the piezoelectric element 100 may receive mechanical energy generated due to a transverse displacement generated at the piezoelectric element 100, and may then transfer the received mechanical energy to the portion of the jig member 200 spaced apart from the piezoelectric element 100. Through such a configuration, the portion of the jig member 200 spaced apart from the piezoelectric element 100 may vibrate vertically at a value amplified from a displacement value generated by the piezoelectric element 100.

That is, the jig member 200 may form a structure optimized for the square piezoelectric element 100, to provide enhanced haptic effects to the user, because the jig member 200 vibrates vertically at an amplified value by concentrating a transverse displacement on the portion thereof spaced apart from the piezoelectric element 100, using a displacement of each corner portion of the piezoelectric element 100 where a maximum transverse displacement is generated.

In addition, as shown in FIGS. 1 to 4, in accordance with the exemplary embodiment of the present invention, the jig member 200 may include a center part 210 disposed at the center of the jig member 200 and spaced apart from the piezoelectric element 100, to vibrate, an edge part 230 contacting each corner of the piezoelectric element 100, to receive mechanical energy generated due to a displacement generated by the piezoelectric element 100, and a bridge part 220 interconnecting the center part 210 and the edge part 230, to transfer the mechanical energy received from the edge part 230 to the center part 210.

In accordance with the exemplary embodiment of the present invention, it may be possible to provide excellent haptic effects through maximal utilization of a displacement value at the corner portion of the piezoelectric element 100 where a maximum displacement is generated and realization of a higher vibrational acceleration.

The center part 210 may be disposed at the center of the jig member 200. When the jig member 200 is coupled to the piezoelectric element 100, the center part 210 may be disposed at the center of the jig member 200 while being spaced apart from the piezoelectric element 100 by a predetermined distance. In more detail, as shown in FIGS. 3 and 4, when the jig member 200 is coupled to the piezoelectric element 100, the center part 210 may be disposed at the center of the piezoelectric element 100 while being spaced apart from the piezoelectric element 100 such that a central axis of the center part 210 is concentric with a central axis of the piezoelectric element 100. The center part 210, which is disposed at the center of the piezoelectric element 100 while being spaced apart from the piezoelectric element 100, may receive energy generated due to a displacement generated by the piezoelectric element 100 and, as such, may vibrate. In detail, the center part 210 may vibrate in a vertical direction parallel to the thickness direction of the piezoelectric element 100.

As shown in FIG. 4, the jig member 200 may be formed to have a cymbal shape in which the width (distance) of the jig member 200 from the piezoelectric element 100 is gradually reduced as the jig member 200 extends from the center part 210 when viewed in a cross-section taken along a diagonal line interconnecting two facing vertexes, that is, a cross-section taken along line D-D' in FIG. 1. Through such a structure, it may be possible to concentrate, on the center part 210, energy generated due to a maximum transverse displacement generated at each corner of the piezoelectric element 100, as will be described later.

The center part 210 may receive energy generated due to a transverse displacement generated at the piezoelectric element 100 via the bridge part 220 and, as such, may vibrate in a vertical direction perpendicular to the direction of the transverse displacement generated at the piezoelectric element 100. The center part 210 may vibrate vertically in an amplitude greater than a transverse displacement value generated by the piezoelectric element 100 in a procedure of receiving the energy generated by the displacement generated at the piezoelectric element 100.

It is preferred that the center part 210 be formed to have a circular shape in order to uniformly receive, from the bridge part 220, mechanical energy generated due to a displacement generated at the piezoelectric element 100 and to maintain balance during vibration thereof. In this case, it is preferred that the center part 210 be formed to have a diameter corresponding to 30 to 60% of a length a of each side of the square piezoelectric element 100, that is, a diameter of 0.3a to 0.6a, in order to implement a cymbal-shaped cross-section as shown in FIG. 4 and to realize optimized shapes of the edge part 230 and the bridge part 220, as will be described later. When the diameter of the center part 210 is greater than 60%, that is, 0.6a, it is difficult to maintain a cymbal shape because the displacement generated at the piezoelectric element 100 spreads excessively. On the other hand, when the diameter of the center part 210 is smaller than 30%, that is, 0.3a, it is difficult to maintain optimized cymbal shapes of the edge part 230 and the bridge part 220, as will be described later. In this case, it is preferred that the diameter of the center part 210 be 0.4a in order to realize an optimal size of the edge part 230 or an optimal radius of curvature of the bridge part 220 under the condition that opposite longitudinal sides of the bridge part 220 are placed on tangent lines of the edge part 230 and the center part 210, respectively, as will be described later.

The edge part 230 may be coupled to the corner portion of the piezoelectric element 100. In more detail, the edge part 230 may be brought into contact with the corner portion of the piezoelectric element 100, at which a maximum displacement is generated, when the piezoelectric element 100 repeatedly expands and contracts. When the piezoelectric element 100 is formed to have a square shape, four edge part 230 may be formed and may be coupled to only the corners of the piezoelectric element 100 in an attached state.

As shown in FIGS. 3 and 4, the edge part 230 may be a sole portion of the jig member 200 contacting the piezoelectric element 100. That is, the jig member 200 may be coupled to the piezoelectric element 100 by the edge part 230, and the center part 210 and the bridge part 220 of the jig member 200 may be formed to be spaced apart from the piezoelectric element 100.

Figure 6:
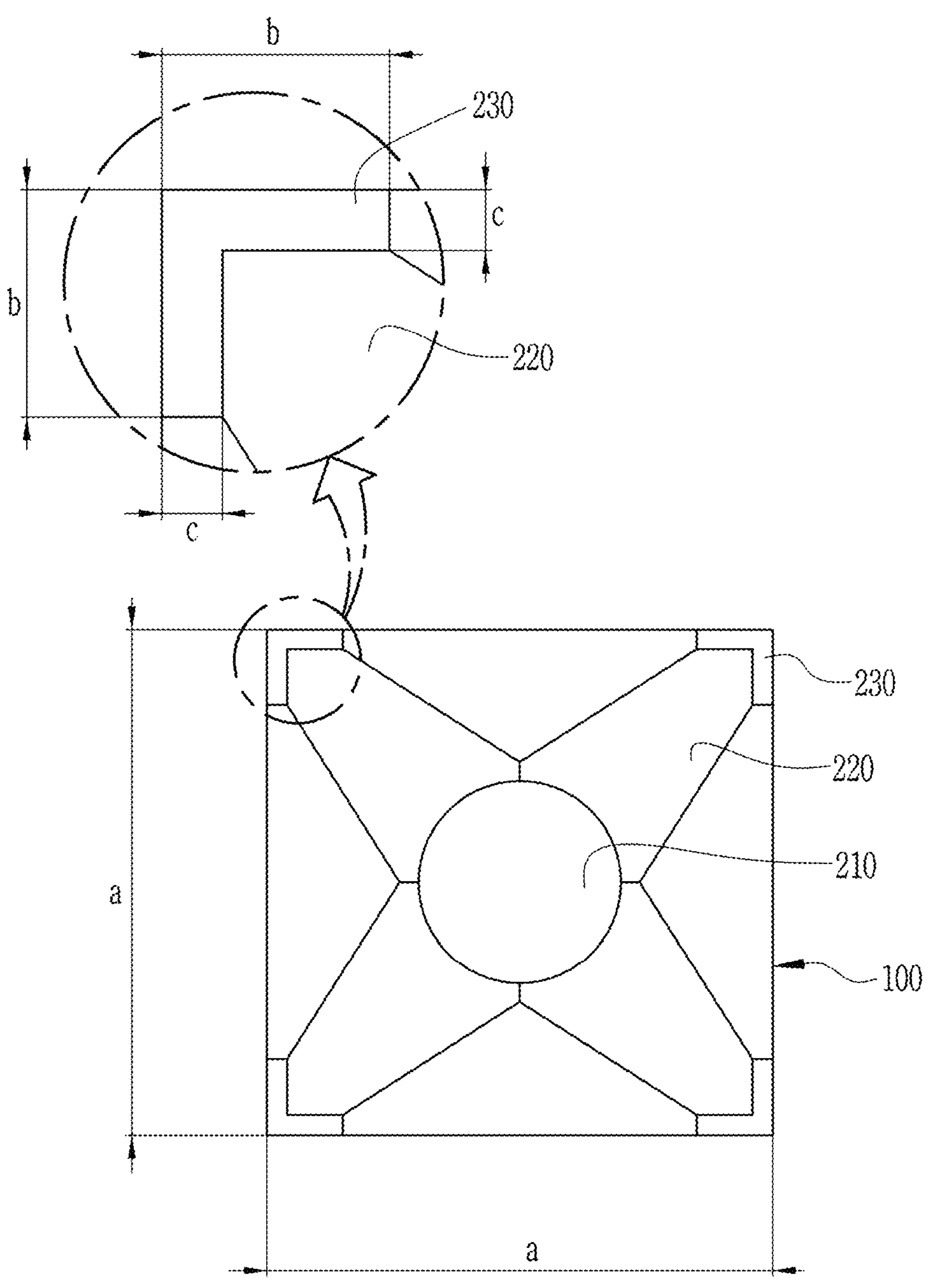
FIG. 6 is a partial enlarged view of the haptic actuator and an edge part thereof according to the exemplary embodiment of the present invention.

In addition, when the piezoelectric element 100 is formed to have a square shape, the edge part 230 may be formed to have a vertically bent shape such that the edge part 230 conforms to each corner portion of the piezoelectric element 100. As shown in FIG. 6, vertical bending of the edge part 230 may mean that the edge part 230 is vertically bent while having a predetermined thickness, thereby forming a "¬" shape, in order to upwardly or downwardly cover the corner portion formed to have a square shape while extending vertically. In this case, a vertically bent portion of the edge part 230 may be a central portion of the edge part 230. That is, when the total length of the edge part 230 is 2b, the edge part 230 may be vertically bent at a point where the edge part 230 has a length of b.

FIG. 6 is a partial enlarged view of the haptic actuator 1 and the edge part 230 according to the exemplary embodiment of the present invention.

As shown in FIG. 6, the length of each side of the piezoelectric element 100, which has a square shape, may be defined as "a", a portion of the edge part 230 disposed in parallel to each side of the piezoelectric element 100 may be defined as "b", which is the length of the edge part 230, and a portion of the edge part 230 disposed to be perpendicular to the length a of each side of the piezoelectric element 100 or the length of the edge part 230 may be defined as "c", which is a thickness of the edge part 230.

Taking into consideration the definition of FIG. 6, it may be seen that, when the length b of the edge part 230 is greater than the thickness c of the edge part 230, the edge part 230 may form a "¬" shape conforming to that of each corner of the piezoelectric element 100. In addition, since the number of edge parts 230 placed on the same line as each side of the piezoelectric element 100 is two, it may be seen that the length b of each edge part 230 should be smaller than a/2. That is, it may be seen that conditions of the thickness c and the length b of the edge part 230 for formation of a vertically bent shape allowing the edge part 230 to be disposed at the corner portion of the square piezoelectric element 100 should satisfy $c<b<a/2$.

In this case, in accordance with the exemplary embodiment of the present invention, it may be possible to implement an optimized shape of the jig member 200 in the square piezoelectric element 100 capable of providing excellent haptic effects, by adjusting a ratio between the length b of the edge part 230 and the thickness c of the edge part 230. Here, excellent haptic effects mean that a higher vibrational acceleration and an increased displacement are generated and, as such, tactile feedback with high resolution is transferred to the user.

Hereinafter, a concrete proportional relation between the size of the piezoelectric element 100 and the shape of the edge part 230 will be discussed through experimental values of a vibrational acceleration and a displacement obtained by adjusting the length b of the edge part 230 and the thickness c of the edge part 230 when the length a of each side of the square piezoelectric element 100 is 10 mm, as represented in Tables 1 and 2.

The following Table 1 represents acceleration values and displacement values obtained in the exemplary embodiment of the present invention when only the length b of the edge part 230 is adjusted under the condition that the thickness c of the edge part 230 is fixed to 1 mm.

TABLE 1

| Length (a) of Each Side of Piezoelectric Element (mm) | Thickness (c) of Edge Part (mm) | Length (b) of Edge Part (mm) | Vibrational Acceleration ($m/s^2$) | Displacement (mm) |
|---|---|---|---|---|
| 10 | 1 | 3.0 | 1.4 | 0.21 |
| 10 | 1 | 2.5 | 1.7 | 0.23 |
| 10 | 1 | 2.0 | 3.1 | 0.26 |
| 10 | 1 | 1.5 | 3.5 | 0.29 |

Referring to Table 1, it can be seen that, when the length b of the edge part 230 is reduced under the condition that the length a of each side of the piezoelectric element 100 is fixed to 10 mm, and the thickness c of the edge part 230 is fixed to 1 mm, an acceleration and a displacement value are increased. In this case, it may be seen that, when the length b of the edge part 230 is smaller than 2.0 mm, the vibrational acceleration is higher than 3.1 $m/s^2$.

Referring to Table 1, the length b of the edge part 230 may be 1.5 to 2.0 mm, preferably, 1.5 mm. When the length b of the edge part 230 exceeds 2.0 mm, the vibrational acceleration generated in the jig member 200 is abruptly decreased. On the other hand, the length b of the edge part 230 is smaller than 1.5 mm, it is impossible to maximally utilize a maximum displacement value generated at the corner of the square piezoelectric element 100. That is, the ratio b/a of the length b of the edge part 230 to the length a of each side of the piezoelectric element 100 may be determined to be 0.15 to 0.20, preferably, 0.15.

The following Table 2 represents acceleration values and displacement values obtained in the exemplary embodiment of the present invention when the thickness c of the edge part 230 is adjusted under the condition that the length a of each side of the piezoelectric element 100 is fixed to 10 mm, and the length b of the edge part 230 is fixed to 1.5 mm.

TABLE 2

| Length (a) of Each Side of Piezoelectric Element (mm) | Length (b) of Edge Part (mm) | Thickness (c) of Edge Part (mm) | Vibrational Acceleration ($m/s^2$) | Displacement (mm) |
|---|---|---|---|---|
| 10 | 1.5 | 1 | 3.5 | 0.29 |
| 10 | 1.5 | 0.9 | 3.6 | 0.30 |
| 10 | 1.5 | 0.8 | 5.4 | 0.31 |
| 10 | 1.5 | 0.7 | 4.2 | 0.32 |
| 10 | 1.5 | 0.6 | 6.8 | 0.33 |
| 10 | 1.5 | 0.5 | 6.4 | 0.34 |
| 10 | 1.5 | 0.4 | 7.0 | 0.35 |
| 10 | 1.5 | 0.3 | 4.8 | 0.36 |
| 10 | 1.5 | 0.2 | 5.1 | 0.36 |

Referring to Table 2, it may be seen that, when the thickness c of the edge part 230 is reduced under the condition that the length b of the edge part 230 is fixed, an acceleration is increased in a predetermined range of the thickness c, and is then decreased. In addition, it may be seen that a displacement value is gradually increased as the thickness c of the edge part 230 is gradually reduced.

It may also be seen that, under the above-described conditions, a high vibrational acceleration and a great displacement value are obtained when the thickness c of the edge part 230 is 0.4 to 0.6 mm, preferably, 0.4 mm. When the thickness c of the edge part 230 is greater than 0.6 mm, the edge part 230 is also brought into contact with a portion of the square piezoelectric element 100 other than the portion of the square piezoelectric element 100 at which a maximum displacement is generated. As a result, the vibrational acceleration is decreased. On the other hand, when the thickness c of the edge part 230 is smaller than 0.4 mm, it is impossible to completely utilize the maximum displacement generated at the corner portion of the square piezoelectric element 100. Accordingly, the ratio c/b of the thickness c of the edge part 230 to the length b of the edge part 230 may be about 0.27 to 0.4, preferably, about 0.27.

Taking into consideration the above Tables 1 and 2, when the length of each side of the piezoelectric element 10 formed to have a square shape is a, as shown in FIG. 6, the length b of the edge part 230 may be determined to be 0.15a to 0.20a, and the thickness c of the edge part 230 may be determined to be 0.27b to 0.4b. Preferably, the length b of the edge part 230 is 0.15a, and the thickness c of the edge part 230 is 0.27b.

The embodiment of the present invention including the edge part 230 satisfying the above-described ratios may form a structure optimized for the piezoelectric element 100 formed to have a square shape through amplification of a vibrational acceleration and a displacement.

Figure 7:
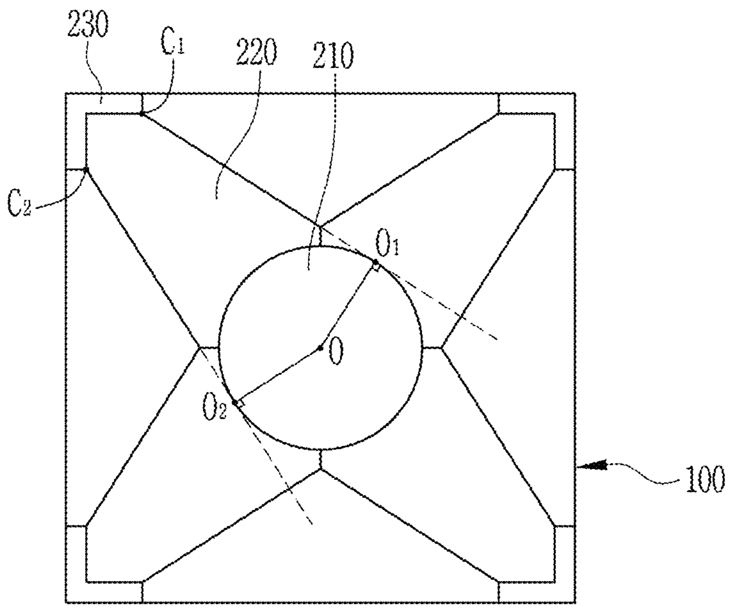
FIG. 7 is a view showing a correlation between tangent lines of a center part and opposite longitudinal sides of a bridge part.
Figure 8:
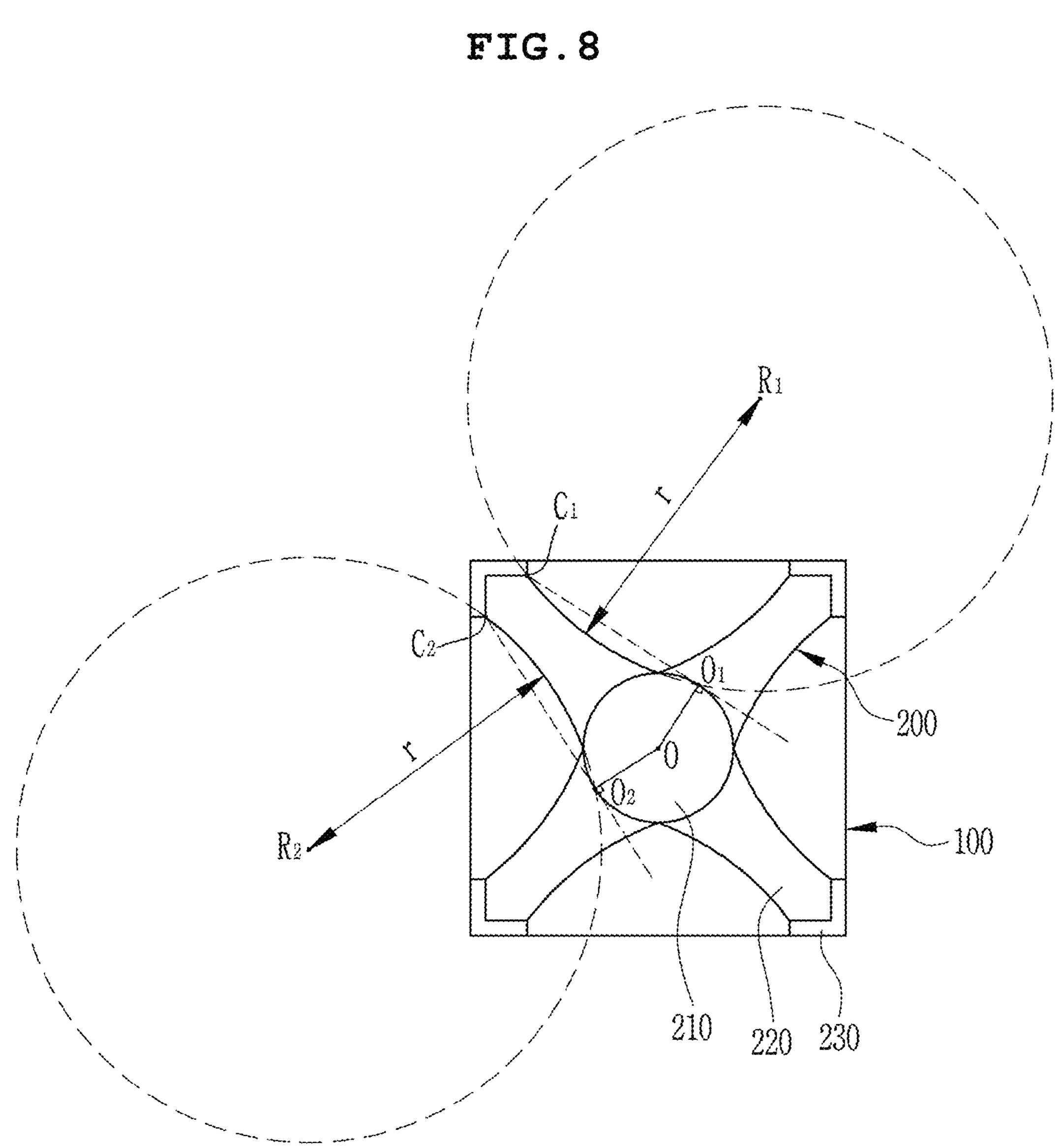
FIG. 8 is a view showing that the opposite longitudinal sides of the bridge part are inwardly bent while having a predetermined radius of curvature.
Figure 9:
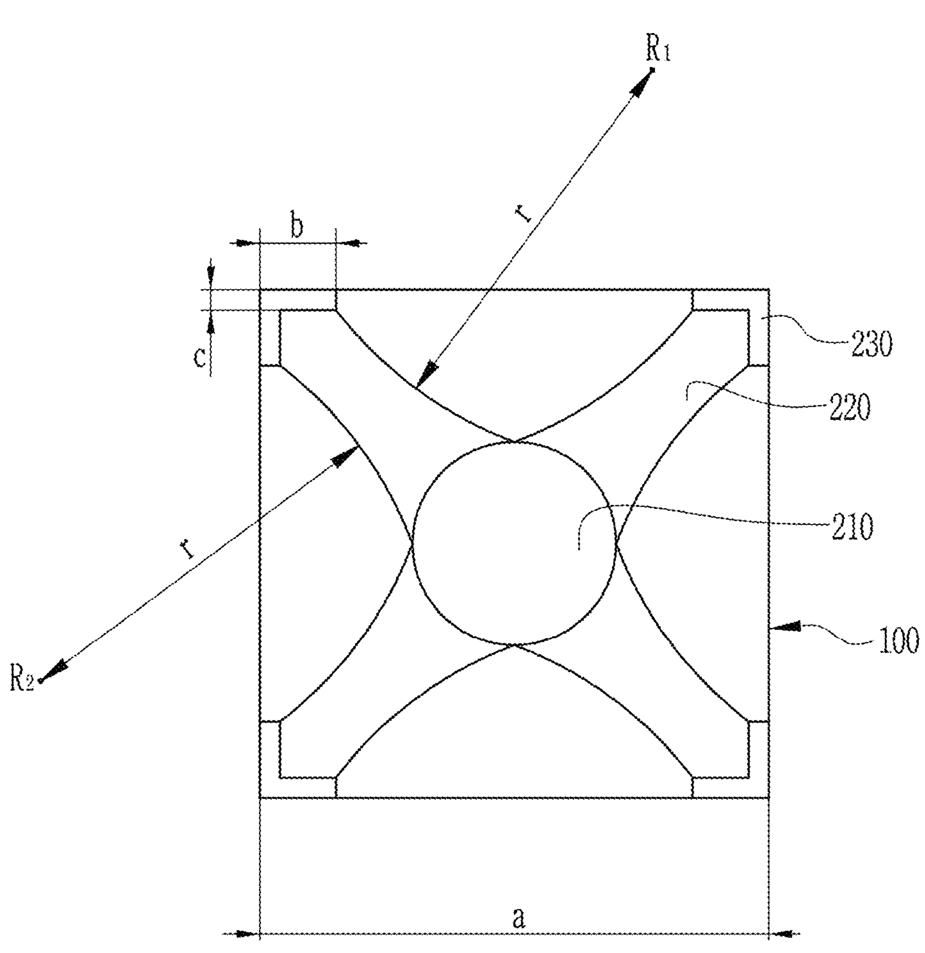
FIG. 9 is a view showing the haptic actuator according to the exemplary embodiment of the present invention.

FIG. 7 is a view showing a correlation between tangent lines of the center part 210 and opposite longitudinal sides of the bridge part 220. FIG. 8 is a view showing that the opposite longitudinal sides of the bridge part 220 are inwardly bent while having a predetermined radius of curvature. FIG. 9 is a view showing the haptic actuator 1 according to the exemplary embodiment of the present invention. The following description will be given referring to FIGS. 7 to 9.

As shown in FIG. 7, the bridge part 220 is connected, at one side thereof, to the edge part 230 while being connected, at the other side thereof, to the center part 210 and, as such, may transfer mechanical energy received from the edge part 230 to the center part 210. The bridge part 220 may concentrate, on the center part 210, a displacement generated from the piezoelectric element 100, thereby amplifying displacement energy, and, as such, the center part 210 may vibrate in a great amplitude, thereby providing excellent haptic effects.

Mechanical energy generated due to the displacement generated at the piezoelectric element 100 may be applied to the bridge part 220 via the edge part 230 of the jig member 200 disposed at each corner of the piezoelectric element 100. The bridge part 220 may transfer, to the center part 210, the mechanical energy generated due to the displacement generated by the piezoelectric element 100. The center part 210 vibrates vertically by the energy received from the bridge part 220, thereby realizing haptic effects.

In this case, it may be possible to amplify the vibrational acceleration and the displacement generated in the embodiment of the present invention by adjusting a concrete shape and a concrete size of the bridge part 220 as well as those of the edge part 230.

The thickness of the bridge part 220, that is, the distance between the opposite longitudinal sides of the bridge part 220, may be determined to be gradually increased as the bridge part 220 extends from the edge part 230 toward the center part 210. Here, the longitudinal direction of the bridge part 220 means a direction in which the bridge part 220 interconnects the edge part 230 and the center part 210, and may mean a direction parallel to a line interconnecting a vertex of the edge part 230 and a midpoint of the center part 210. The bridge part 220 formed as described above may efficiently uniformly transfer concentrated mechanical energy received from the edge part 230 to the center part 210.

In addition, as shown in FIG. 7, when the center part 210 has a circular shape, the opposite longitudinal sides of the bridge part 220 may be placed on tangent lines interconnecting opposite ends $C_1$ and $C_2$ of the edge part 230 in a thickness (c) direction of the edge part 230 and contact points $O_1$ and $O_2$ of the center part 210, respectively.

Here, the opposite ends $C_1$ and $C_2$ of the edge part 230 in the thickness (c) direction may mean ends of the thickness c of the edge part 230 disposed near the center part 210 without being connected to ends of the length b of the edge part 230, respectively. In addition, the contact points $O_1$ and $O_2$ of the center part 210 may mean contact points placed on tangent lines between respective opposite ends $C_1$ and $C_2$ of the edge part 230 in the thickness (c) direction and the center part 210 formed to have a circular shape, as shown in FIG. 7. That is, when lines are drawn from the opposite ends $C_1$ and $C_2$ of the edge part 230 in the thickness (c) direction to the contact points $O_1$ and $O_2$ of the center part 210, respectively, the lines may become tangent lines of the center part 210 formed to have a circular shape, and the opposite longitudinal sides of the bridge part 220 may be formed to be placed on the tangent lines as described above, respectively.

Through such a configuration, the opposite longitudinal sides of the bridge part 220 may be formed to be placed on the tangent lines between respective opposite ends $C_1$ and $C_2$ of the edge part 230 in the thickness (c) direction and the center part 210, respectively. The bridge part 220 formed as described above may transfer, in a balanced manner, energy received from the edge part 230 to the center part 210 formed to have a circular shape.

In addition, as shown in FIGS. 8 and 9, the opposite longitudinal sides of the bridge part 220 may be formed to be inwardly bent while having a predetermined radius of curvature. In this case, an inward direction of the bridge part 220 may mean a direction of a line interconnecting a vertex of the edge part 230 formed in accordance with bending of the edge part 230 and a midpoint O of the center part 210. That is, the opposite longitudinal sides of the bridge part 220 may be bent in a direction closer to the line interconnecting the vertex of the edge part 230 and the midpoint O of the center part 210 while having a predetermined radius of curvature. Through such a structure, the bridge part 220 may further concentrate energy received from the edge part 230, and may then transfer the concentrated energy to the center part 210.

Meanwhile, as shown in FIG. 8, circles (circles having centers R1 and R2) bending the opposite longitudinal sides of the bridge part 220 in a predetermined radius of curvature r may be circumscribed on the center part 210 while passing through respective opposite ends $C_1$ and $C_2$ of the edge part 230 and respective contact points $O_1$ and $O_2$ of the center part 210.

In other words, the opposite longitudinal sides of the bridge part 220 may be formed to be bent in the radius of curvature r by the circles (the circles having the centers R1 and R2) circumscribed on the center part 210 while passing through respective opposite ends $C_1$ and $C_2$ of the edge part 230 in the thickness (c) direction, respectively. That is, the opposite longitudinal sides of the bridge part 220 may be formed to be inwardly bent by the circles passing through respective opposite ends $C_1$ and $C_2$ of the edge part 230 in the thickness (c) direction and respective contact points $O_1$ and $O_2$ of the center part 210.

Through the above-described structure, the bridge part 220 may inwardly concentrate energy received from the edge part 230 and, as such, may efficiently propagate, in a balanced manner, the concentrated energy to the center part 210 formed to have a circular shape.

The following Table 3 represents acceleration values and displacement values obtained when the radii of curvature of the opposite longitudinal sides of the bridge part 220 are varied under the condition the length of each side of the square piezoelectric element 100 is fixed to 10 mm.

TABLE 3

| Length (a) of Each Side of Piezoelectric Element (mm) | Length (b) of Edge Part (mm) | Thickness (c) of Edge Part (mm) | Radius of Curvature (r) (mm) | Vibrational Acceleration ($m/s^2$) | Displacement (mm) |
|---|---|---|---|---|---|
| 10 | 1.5 | 0.4 | 0 | 7.0 | 0.35 |
| 10 | 1.5 | 0.4 | 4 | 4.2 | 0.34 |
| 10 | 1.5 | 0.4 | 5 | 7.4 | 0.35 |
| 10 | 1.5 | 0.4 | 6 | 4.8 | 0.35 |
| 10 | 1.5 | 0.4 | 7 | 4.6 | 0.35 |
| 10 | 1.5 | 0.4 | 9 | 8.6 | 0.35 |
| 10 | 1.5 | 0.4 | 9 | 8.6 | 0.35 |
| 10 | 1.5 | 0.4 | 10 | 6.4 | 0.35 |

In association with the case in which the radius of curvature r is 0, Table 3 represents an acceleration and a displacement obtained when the opposite longitudinal sides of the bridge part 220 are linearly formed without having a curvature. Referring to Table 3, it may be seen that an acceleration is increased to a predetermined level, and is then decreased as the radius of curvature of the opposite longitudinal sides of the bridge part 220 is increased.

It may also be seen that, when the radius of curvature is 8 to 9 mm, the vibrational acceleration is greatly enhanced, as compared to the case in which there is no curvature (r=0 mm). When the radius of curvature is smaller than 8 mm under the above-described conditions, energy generated due to the displacement of the piezoelectric element 100 is excessively concentrated in an inward direction of the bridge part 220 and, as such, it is difficult to vibrate the center part 210 in a state in which the energy is uniformly propagated to the center part 210. When the radius of curvature exceeds 0.9 mm, it is difficult to appropriately concentrate energy by the bridge part 220 and, as such, the vibrational acceleration is decreased. That is, the ratio r/a of the radius of curvature r to the length a of each side of the square piezoelectric element 100 may be determined to be 0.8 to 0.9, preferably, 0.9.

That is, taking into consideration Tables 1 to 3, it is preferred that, when the length b of the edge part 230 is 0.15a, and the thickness c of the edge part 230 is 0.27b, under the condition that the length of each side of the piezoelectric element 100 formed to have a square shape is a, the radius of curvature of the opposite longitudinal sides of the bridge part 220 be 0.8a to 0.9a.

The jig member 200 satisfying the above-described size ratios may be formed to have a structure as shown in FIG. 8. The jig member 200 formed to have such a structure may maximally utilize a displacement generated at the piezoelectric element 100, thereby amplifying the vibrational acceleration and the displacement, and, as such, may provide excellent haptic effects with high resolution to the user. Accordingly, an efficient geometric structure may be implemented in association with use of the square piezoelectric element 100.

As apparent from the above description, the haptic actuator according to the exemplary embodiment of the present invention may vibrate in an amplified state by utilizing a displacement generated at the piezoelectric element and, as such, may provide excellent haptic effects with high resolution to the user.

In addition, the haptic actuator includes a jig member optimized for a square piezoelectric element. Accordingly, the haptic actuator may sufficiently utilize a displacement value of the square piezoelectric member and, as such, a high acceleration and a great displacement value may be generated using even a small voltage.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

Simple modifications and alterations fall within the scope of the invention, and the protection scope of the invention will be apparent from the appended claims.

What is claimed is:

1. A haptic actuator comprising:

a polygonal piezoelectric element formed to have a square shape and configured to generate a displacement thereof while expanding and contracting in accordance with polarities of a voltage applied thereto; and a jig member coupled to the polygonal piezoelectric element at upper and lower square sides of the polygonal piezoelectric element in a thickness direction of the polygonal piezoelectric element in a state of contacting only corner portions of the polygonal piezoelectric element and configured to amplify the displacement generated at the polygonal piezoelectric element, thereby vibrating;

wherein the jig member comprises a center part disposed at a center of the jig member and spaced apart from the polygonal piezoelectric element, to vibrate, the center part is formed to have a circular shape;

an edge part contacting each corner portion of the polygonal piezoelectric element, to receive mechanical energy generated due to the displacement generated by the piezoelectric polygonal element, wherein the edge part is formed to have a vertically bent shape such that the edge part conforms to each corner portion of the polygonal piezoelectric element; and a bridge part interconnecting the center part and the edge part, to transfer the mechanical energy received from the edge part to the center part and the bridge part is formed such that opposite longitudinal sides thereof are placed on tangent lines between opposite ends of the edge part in a thickness direction of the edge part and the center part, respectively.

2. The haptic actuator according to claim 1, wherein the bridge part is formed such that the opposite longitudinal sides thereof are inwardly bent while having a predetermined radius of curvature (r).

3. The haptic actuator according to claim 2, wherein the bridge part is formed such that the opposite longitudinal sides thereof are bent while having the predetermined radius of curvature (r) by circles circumscribed on the center part while passing through respective opposite ends of the edge part in the thickness direction of the edge part, respectively.

4. The haptic actuator according to claim 1, wherein a ratio (b/a) of a length (b) of the edge part disposed in parallel to each side of the polygonal piezoelectric element with respect to a length (a) of the side of the polygonal piezoelectric element is 0.15 to 0.20.

5. The haptic actuator according to claim 1, wherein:

a ratio (b/a) of a length (b) of the edge part disposed in parallel to each side of the polygonal piezoelectric element with respect to a length (a) of the side of the polygonal piezoelectric element is 0.15; and a ratio (c/b) of a thickness (c) of the edge part disposed perpendicularly to the length (b) of the edge part with respect to the length (b) of the edge part is 0.27 to 0.4.

6. The haptic actuator according to claim 1, wherein:

a ratio (b/a) of a length (b) of the edge part disposed in parallel to each side of the polygonal piezoelectric element with respect to a length (a) of the side of the polygonal piezoelectric element is 0.15;

a ratio (c/b) of a thickness (c) of the edge part disposed perpendicularly to the length (b) of the edge part with respect to the length (b) of the edge part is 0.27; and the bridge part is formed such that opposite longitudinal sides thereof are inwardly bent while having a predetermined radius of curvature (r), and a ratio (r/a) of the predetermined radius of curvature (r) with respect to the length (a) of the side of the polygonal piezoelectric element is 0.8 to 0.9.

* * * * *